United States Patent
Loew

(10) Patent No.: US 7,193,533 B2
(45) Date of Patent: Mar. 20, 2007

(54) OPERATING ELEMENT WITH SETTABLE SELECTIVITY

(75) Inventor: Andreas Loew, Gross-Gerau (DE)

(73) Assignee: Thomson Licensing, Boulogne-Billancourt (FR)

( * ) Notice: Subject to any disclaimer, the term of this patent is extended or adjusted under 35 U.S.C. 154(b) by 715 days.

(21) Appl. No.: 10/612,186

(22) Filed: Jul. 2, 2003

(65) Prior Publication Data
US 2004/0076227 A1  Apr. 22, 2004

(30) Foreign Application Priority Data
Jul. 11, 2002  (DE) ................................ 102 31 332

(51) Int. Cl.
  *H03M 1/22*  (2006.01)
(52) U.S. Cl. .............................. 341/2; 341/50
(58) Field of Classification Search ................. 341/50, 341/2; 348/345, 224; 700/186
See application file for complete search history.

(56) References Cited

U.S. PATENT DOCUMENTS 4,641,185 A * 2/1987 Alston et al. ................ 358/535
4,725,959 A * 2/1988 Nagata ........................ 700/186
5,544,061 A * 8/1996 Morimoto et al. ........... 701/202
5,638,060 A * 6/1997 Kataoka et al. ................ 341/20
5,659,480 A * 8/1997 Anderson et al. ........... 700/186
5,999,215 A * 12/1999 Tamura ....................... 348/345

OTHER PUBLICATIONS

JP 01281501 A., In: Patent Abstracts of Japan; Text u.Figur d.Abstracts, no date.
JP 62231315 A., In: Patent Abstracts of Japan; Text u.Fig. des Abstracts, no date.
Search Report for German Patent Appln. 10231332.6 dated Oct. 29, 2002.

\* cited by examiner

*Primary Examiner*—Jean Bruner Jeanglaude
(74) *Attorney, Agent, or Firm*—Joseph J. Laks; Robert D. Shedd; Reitseng Lin

(57) ABSTRACT

An operating element with a settable operating characteristic for generating numerical control values A converts position signals P corresponding to the position of a linear sensor element into control values A using an assignment characteristic curve. Different assignment characteristic curves can be selected by means of a control quantity K. An arrangement for processing video or audio signals processes input signals $S_{in}$ accordance with a function $S_{out}$ (A, $S_{in}$). The numerical control values A are fed by means of an operating element to the arrangement for processing video or audio signals.

13 Claims, 3 Drawing Sheets

OPERATING ELEMENT WITH SETTABLE SELECTIVITY

FIELD OF THE INVENTION

The invention relates to the field of operating elements for apparatuses whose functions are controlled by means of numerical control values. In particular, the invention relates to operating elements which generate position signals corresponding to the position of an actuation element, which signals are converted into numerical control values by means of a converter.

BACKGROUND OF THE INVENTION

For the control of functions in apparatuses, e.g. for the processing of audio or video signals, use is often made of operating elements which communicate numerical control values in a specific range of values to the apparatus which performs the actual function. These operating elements generally have an actuation element to which a sensor element is fitted. Rotary encoders or linearly actuated sensor elements are usually used for actuation. The position of the sensor element is detected by a pickup, which generates a position signal corresponding to the position. A converter then converts the position signal linearly into numerical control values.

For a particularly finely graded processing, use is made e.g. of a converter with a resolution of 16 bits, which corresponds to a range of values from 0 to 65535. Often, a boosting or attenuation function is intended to be carried out by means of a single operating element. This is achieved by the declaration of a virtual central position or zero position for a value in the middle of the entire range of values. Setting values below the middle value thus declared then leads to an attenuation, and values above the middle value correspondingly lead to a boosting of the processed signal.

In the case of a linear conversion of the position of the actuation element, relatively small corrections of the processed audio or video signal are associated with small alterations of the position of the actuation element. Relatively large corrections of the processed audio or video signal are correspondingly associated with large alterations of the position of the actuation element.

In many cases, the signal to be processed only requires slight corrections. In this case, the extreme ranges of values, at 0 and 65535 in the abovementioned example, are only rarely utilized.

Depending on the design, the linear conversion can have the effect that the operability becomes difficult in the region of small corrections since even very small movements of the actuation element lead to corresponding changes in value. In the case of a large correction, the operator has to perform large movements in order to set the high correction value desired. Under certain circumstances, the large movement required cannot be performed rapidly enough.

This problem can be solved through the combination of a coarse regulator and an associated fine regulator. However, this is often not possible or desired for cost reasons or for space reasons and owing to the poorer operability.

SUMMARY OF THE INVENTION

It is an object of the invention to enable the sensitive, accurate setting of control values for small corrections and the rapid, coarse setting of large control values for large corrections by means of a single operating element. The invention further relates to an arrangement for processing audio or video signals with an operating element according to the invention for controlling the function.

An operating element according to the invention achieves the object by virtue of the fact that the control values which are generated by the converter in an operating element of the above type are fed to a converter before being forwarded to the apparatus which performs the function. The conversion is effected in accordance with an assignment characteristic curve which can be selected by means of a control quantity.

In this case, the invention advantageously exploits the fact that generally the range of relatively small corrections has to be resolved more finely than the range of relatively large corrections, which, moreover, are also necessary less frequently.

The converter of the operating element according to the invention converts the linear control values of the converter in such a way that, in the range around the defined middle value, only an alteration of the input control value by a plurality of counting steps effects an alteration of the output control value by a counting step.

Very fine gradation is not necessary in the range of relatively large control values of the converter, that is to say in the ranges around 0 and around 65535 for a 16-bit converter. In these ranges, the converter converts the input control values of the converter such that an alteration of the input control value by one counting step already effects an alteration of the output control value by a plurality of counting steps. This ensures that the entire range of values of the input control values is also available as a range for the output control values.

The characteristic of the assignment characteristic curve can be set by means of a control quantity. A centrosymmetry with respect to a middle value can be preserved independently of the selected value of the control quantity. This ensures that both an attenuation and a boosting can be performed with the same resolution relative to the middle value. Furthermore, the setting of the characteristic curve by means of a control quantity enables an individual adaptation of the characteristic of the operating element to the operator's desires.

The control quantity can be used to set the gradient of the assignment characteristic curve in the range around the middle value. As a result, the response sensitivity of the operating element is selectable in this range.

A reversal of the above-described characteristic of the operating element can likewise be achieved by means of the selectable assignment characteristic curve. In that case, the control values in the extreme ranges of values can be set in finely resolved fashion, and the range around the middle value is set with a coarse resolution. As a result, the user can advantageously perform fine settings at the extreme ranges of values. The range of the middle value can then be traversed rapidly with a small movement of the sensor element.

In a preferred exemplary embodiment, the characteristic curve follows the formula $$A = \left(1 - \left(1 - \frac{E}{M}\right)^K\right) * M \qquad (1)$$

for values below the middle value and the formula $$A = \left(1 + \left(\frac{E}{M} - 1\right)^K\right) * M \qquad (2)$$

for values above the middle value.

In formulae (1) and (2),

A denotes output control value

E denotes input control value

M denotes middle value

K denotes variable control quantity.

However, other mathematical relationships can also be used; in particular, instead of the formulistic calculation, it is also possible to use a characteristic curve which, analytically, cannot be described, or can only be described with great complexity, in the form of an assignment table or look-up table. Furthermore, depending on the user's requirement, the characteristic curve may also be of asymmetrical design.

An arrangement according to the invention for the color correction of illegal colors in video signals contains an operating element described above. Apparatuses for the color correction of illegal colors are used for example wherever color video signals are converted from one signal representation into another, e.g. from an RGB signal into a chrominance-luminance signal. If signal levels outside a predetermined signal range occur during the conversion of the signal components in the new signal representation, this can lead to corruptions of the hue. Such color signals are referred to as illegal colors. In order to correct said corruptions the signal levels are processed by means of an arrangement known per se for the correction of illegal colors. Such arrangements contain operating elements by means of which an operator applies control values for correction to an apparatus which carries out the actual correction function in a known manner. Generally, only slight corrections are necessary, encompassing both boosting and attenuating of the signal level. An operating element of the conventional form would thus be used only in the range around a previously declared middle value. The extreme ranges of values would rarely be used. In a conventional linear operating element, the response sensitivity of the operating element would be so large in this range that even very small movements of the actuation element would lead to alterations of the output control value. An arrangement according to the invention for the correction of illegal colors enables the small corrections that are required frequently to be carried out in particularly finely resolved fashion.

Further areas of application and configurations of the invention lie within the technical expertise of the person skilled in the art. In particular, the operating element according to the invention is not restricted to use in apparatuses for the color correction of illegal colors, it can also be used e.g. in the post-processing of contrast and brightness of video signals or in the processing of audio signals, such as e.g. altering the pitch. However, the operating element according to the invention can also be used in arbitrary other apparatuses in which settings are performed by an operator.

BRIEF DESCRIPTION OF THE DRAWING

The invention is explained in more detail below using an example and with reference to the drawing, in which.

DETAILED DESCRIPTION OF PREFERRED EMBODIMENT

Figure 1:
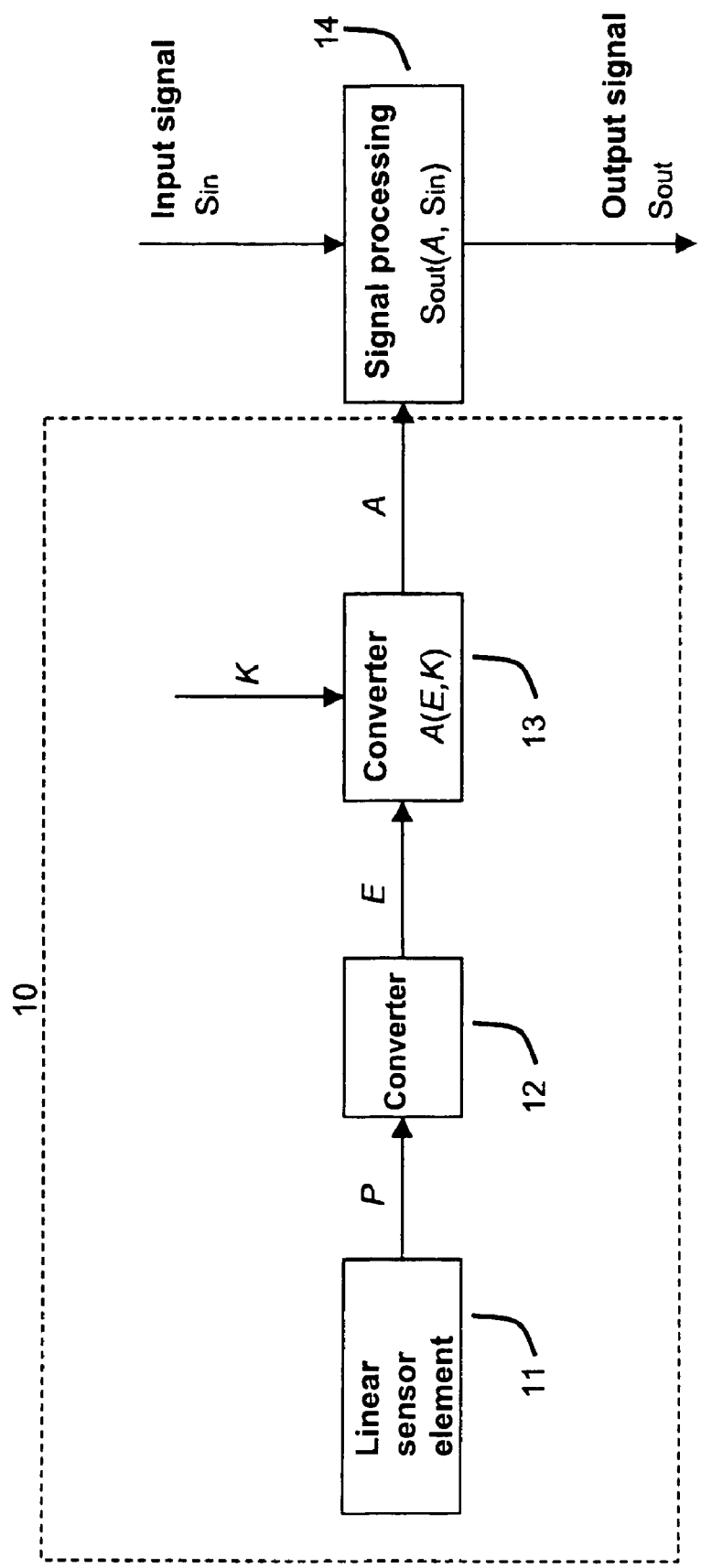
FIG. 1 shows a schematic block diagram of an arrangement according to the invention for processing signals with an operating element according to the invention.

FIG. 1 shows an arrangement for processing signals in a schematic block diagram. An operating element 10 according to the invention is provided in the arrangement shown. In the operating element 10, a linear sensor element 11 generates position signals P corresponding to the position of an actuation element (not illustrated in the figure). The position signals P are fed to a converter 12. The converter 12 converts the position signals into numerical input control values (E) which are fed to a converter 13. In the converter 13, the numerical input control values E are converted into numerical output control values A in accordance with an assignment characteristic curve A(E,K). A control quantity K fed to the converter 13 serves for the selection of an assignment characteristic curve A(E,K). The numerical output control values A are present at an output of the operating element and are fed to a signal processing block 14. The signal processing block 14 processes an input signal $S_{in}$ in accordance with its specific function and provides an output signal $S_{out}$ in the form $S_{out}(A, S_{in})$.

Figure 2:
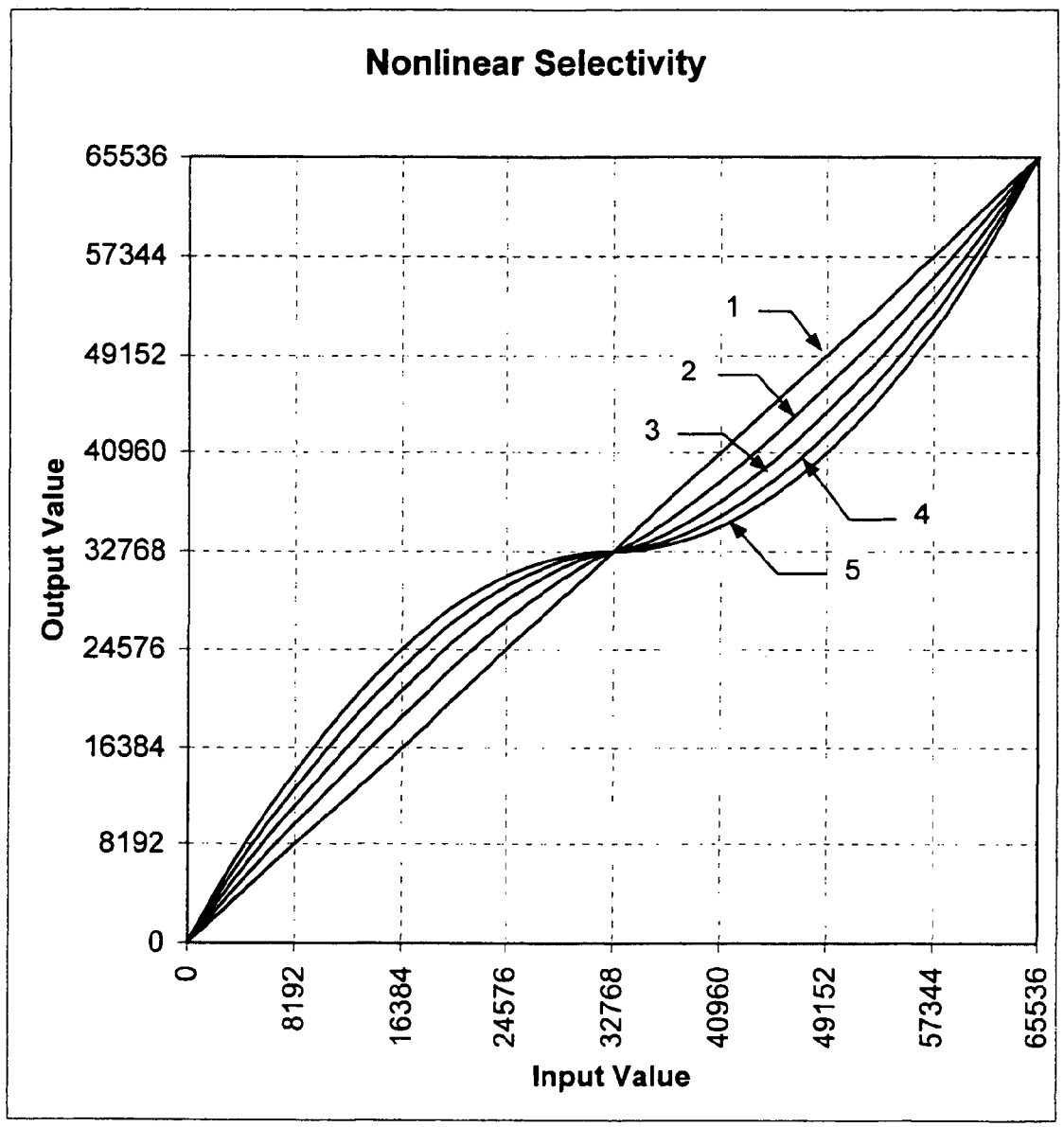
FIG. 2 shows an example of the characteristic curves of the conversion from input to output control value for different values of the control quantity.

FIG. 2 shows the profile of the assignment characteristic curve for an operating element 10 according to the invention, by means of which a range of values corresponding to values from 0 to 65535 can be set given a resolution of the converter 12 of 16 bits, for different values of the control quantity K. It should be noted that sensor elements with other, higher or lower, settable ranges of values can also be used.

For the range of values specified, the arithmetic mean M is 32768 ($2^{16}:2=2^{15}=32768$).

Formulae (3) and (4) for forming the assignment characteristic curve then read as follows in accordance with formulae (1) and (2) specified above.

$$A = \left(1 - \left(1 - \frac{E}{32768}\right)^K\right) * 32768 \qquad (3)$$

for a range of the input control values E from 0 to 32768, and $$A = \left(1 + \left(\frac{E}{32768} - 1\right)^K\right) * 32768 \qquad (4)$$

for a range of the input control values E from 32769 to 65535.

Curve 1 here shows the case of the linear relationship of input to output control values for the value K=1. Curves 2 to 5 show assignment characteristic curves for values from K=1.25 to 2.0 in steps of 0.25. It can clearly be discerned that the entire range of input control values is available as output control values.

Figure 3:
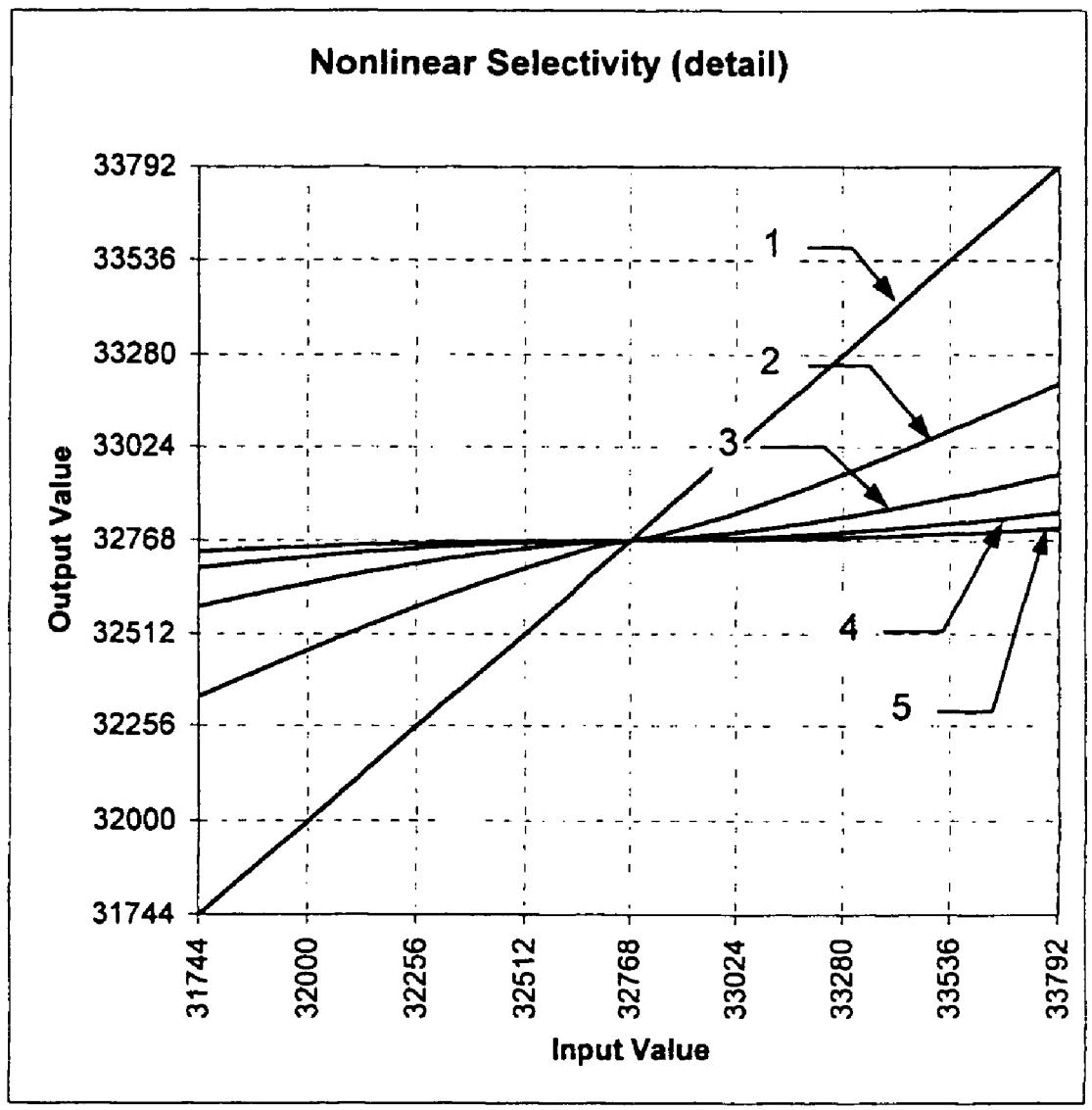
FIG. 3 shows the characteristic curves of the conversion from FIG. 1 in the range around the arithmetic mean.

FIG. 3 shows a detail of the curves from FIG. 2 in the range around the arithmetic mean 32768. It can be discerned here that the characteristic curve 1 (linear) effects corresponding changes in the output values even in the case of small changes in the input values. Curves 2 to 5 for values for K from 1.25 to 2 in steps of 0.25 show a relative insensitivity in the range around the midpoint, so that a particularly sensitive setting by the operator is provided here.

What is claimed is:

1. A control apparatus having a user manipulated operating element and a pickup, which generates position signals corresponding to the position of the operating element, which position signals are translated into first numerical values by means of a first converter and are available as numerical values at an output, wherein the first numerical values are translated into second numerical values in accordance with an assignment characteristic curve in a second converter, wherein a control quantity is applied to the second converter, which effects the selection of a specific assignment characteristic curve from a plurality of curves.

2. The control apparatus as claimed in claim 1, wherein the achievable range of the numerical values available at the output encompasses the range of the position signals.

3. The control apparatus as claimed in claim 1, wherein the operating element comprises an actuation element, and the gradient of the assignment characteristic curve is set in the range around the central position of the actuation element.

4. The control apparatus as claimed in claim 1, wherein the operating element comprises an actuation element, and the assignment characteristic curve is centrosymmetrical with respect to the central position of the actuation element.

5. The control apparatus as claimed in claim 1, wherein the operating element comprises an actuation element, and the conversion of the position signals into numerical values available at the output correspond to a fine resolution in the range around the central position of the actuation element and to a coarse resolution in the region of the smallest and largest position signals, respectively.

6. The control apparatus as claimed in claim 1, wherein the operating element comprises an actuation element, and the conversion of the position signals into numerical values available at the output correspond to a coarse resolution in the range around the central position of the actuation element and to a fine resolution in the region of the smallest and largest position signals, respectively.

7. The control apparatus as claimed in claim 1, wherein the operating element comprises an actuation element, and the selection of an assignment characteristic curve by means of the control quantity corresponds to a selection of the sensitivity of the actuation element.

8. An arrangement for processing at least one of video and audio signals having a control apparatus as claimed in any one of the preceding claims 1 to 6.

9. The arrangement as claimed in claim 8, wherein the processing of video signals comprises the correction of color signals.

10. The arrangement as claimed in claim 8, wherein the processing of video signals comprises at least one of setting picture brightness and picture contrast.

11. The control apparatus as claimed in claim 7, wherein the operating element selects a position in an editing control unit.

12. The arrangement as claimed in claim 8, wherein the processing of at least one of video and audio signals comprises setting a pitch.

13. A control apparatus comprising:

a user manipulated operating element, which operating element generates position signals corresponding to the position of the operating element;

a first converter translating the position signals into first numerical values; and a second converter translating the first numerical values into second numerical values in accordance with an assignment characteristic curve;

wherein, a control quantity is applied to the second converter, which effects the selection of the assignment characteristic curve from a plurality of characteristic curves.

* * * * *